United States Patent [19]
Belcher et al.

[11] Patent Number: 5,520,299
[45] Date of Patent: May 28, 1996

[54] ETCHING PYROELECTRIC DEVICES POST ION MILLING

[75] Inventors: James F. Belcher, Plano; Howard R. Beratan, Richardson, both of Tex.

[73] Assignee: Texas Instruments Incorporated, Dallas, Tex.

[21] Appl. No.: 389,531

[22] Filed: Feb. 15, 1995

[51] Int. Cl.$^6$ .............................. B44C 1/22; C03C 15/00
[52] U.S. Cl. .................. 216/66; 156/642.1; 156/648.1; 156/649.1; 156/651.1; 216/57; 216/80; 216/97
[58] Field of Search .................. 156/630.1, 633.1, 156/634.1, 643.1, 648.1, 649.1, 656.1, 651.1; 216/24, 41, 57, 66, 80, 97

[56] References Cited

U.S. PATENT DOCUMENTS

| | | | |
|---|---|---|---|
| 2,927,771 | 5/1990 | Ferrett | 437/3 |
| 4,080,532 | 3/1978 | Hopper | 250/332 |
| 4,593,456 | 6/1986 | Cheung | 437/3 |
| 4,745,278 | 5/1988 | Hanson | 250/338.2 |
| 4,792,681 | 12/1988 | Hanson | 250/338.2 |

*Primary Examiner*—William Powell
*Attorney, Agent, or Firm*—Ruben C. DeLeon; James C. Kesterson; Richard L. Donaldson

[57] ABSTRACT

This is a system and method of etching pyroelectric devices post ion milling. The method may comprise: forming a mask 32 for thermal isolation trenches on a substrate 14; ion milling thermal isolation trenches 40 in the substrate 14; and etching undesired defects 44 caused by the ion milling by applying a dry etch, a solvent etch, or a liquid etch to the trenches. The etch may include: hydrofluoric acid, perchloric acid, a solution of a chlorine salt and water which is then exposed to ultraviolet light or any similar chemical solution giving the correct reducing properties. The mask 32 and ion milling may be applied from either the front side or the back side of the infrared detector.

23 Claims, 1 Drawing Sheet

# 5,520,299

ETCHING PYROELECTRIC DEVICES POST ION MILLING

FIELD OF THE INVENTION

This invention generally relates to the fabrication of infrared (IR) imaging arrays of the low temperature, pyroelectric type and more specifically to inter-pixel thermal isolation.

BACKGROUND OF INVENTION

A line scanner may contain from several hundred to a few thousand and an area imager several thousand to tens of thousand individual picture elements (pixels.) An infrared (IR) imaging array has been described in detail in (1) U.S. Pat. No. 4,080,532, Hopper, 3/1978; (2) U.S. Pat. No. 4,745,278, Hanson, 5/1988; (3) U.S. Pat. No. 4,792,681, Hanson, 12/1988 and (4) "LOW-COST UNCOOLED FOCAL PLANE ARRAY TECHNOLOGY", by Hanson, Beratan, Owen and Sweetser; presented Aug. 17, 1993 at the IRIS Detector Specialty Review. The solid state system described in these references consists of a hybrid circuit arrangement of an IR sensing array electrically bonded to an associated integrated circuit sensing array. Each pixel in these arrays consists of a capacitor that has a heat (IR intensity) sensitive dielectric such as barium-strontium-titanate (BST). BST is a hard ceramic like material which is difficult to pattern into the small geometries required for this application.

One of the methods used to thermally isolate the small capacitive pixels is ion milling as has been described in the references. Ion milling however is not an electrically or chemically clean process and may leave undesired by-products which cause structural and electrical device problems. The common method of reducing these problems is to alter the ion mill parameters such as etch rate, power, vacuum pressure, chemical atmosphere and so on. Because of the numerous variables involved, this solution has proved to be difficult.

SUMMARY OF THE INVENTION

In accordance with this invention, the disadvantages and problems associated with ion milling isolated pixel capacitors in a barium-strontium-titanate substrate for a low temperature IR imaging array have been substantially reduced. This invention improves the electrical properties of an IR imaging array by removing ion mill damaged material. This invention also removes any residual unwanted material which has been redeposited on the substrate during the process of ion milling.

A novel etch process is described which will preferentially remove the unwanted BST material without damage to the remaining pixel dielectric material. This is a system and method of etching pyroelectric devices post ion milling. The method may comprise: forming a mask for thermal isolation trenches on a substrate; ion milling thermal isolation trenches in the substrate; and etching undesired defects caused by the ion milling by applying an etch to the trenches. The etch may be a wet acid, a dry etch, solvent etch or a ultra violet (UV) etch. A dry etch may include $CF_4$, $O_2$, $F_{12}$, H, or $SF_6$. The solvent etch may include IPA, Acetone, $MF_{312}$, or $H_2O$. A wet etch may include: hydrofluoric acid, acetic, HCl, $HNO_3$, HBr, HI, $NH_4F$, $NH_4BR$, $NH_4I$, $CaF_2$, KBr, NaI, hydrogen chloride, peroxide, phosphoric, perchloric acid, a solution of a chlorine salt and water which is then exposed to ultraviolet light or any similar chemical solution giving the correct reducing properties. The UV etch may include a chloride solution constituting of ten percent (10%) HCl plus water such that during irradiation, unmasked regions become substantially more reactive with the etchant than they are absent exposure to the UV radiation. The mask and ion milling may be applied from either the front side or the back side of the infrared detector.

BRIEF DESCRIPTION OF THE DRAWINGS

This invention can be best understood by reference to the following drawing(s), in which.

Corresponding numerals and symbols in different figures refer to corresponding pans unless otherwise indicated.

DETAILED DESCRIPTION OF PREFERRED EMBODIMENTS

Figure 1:
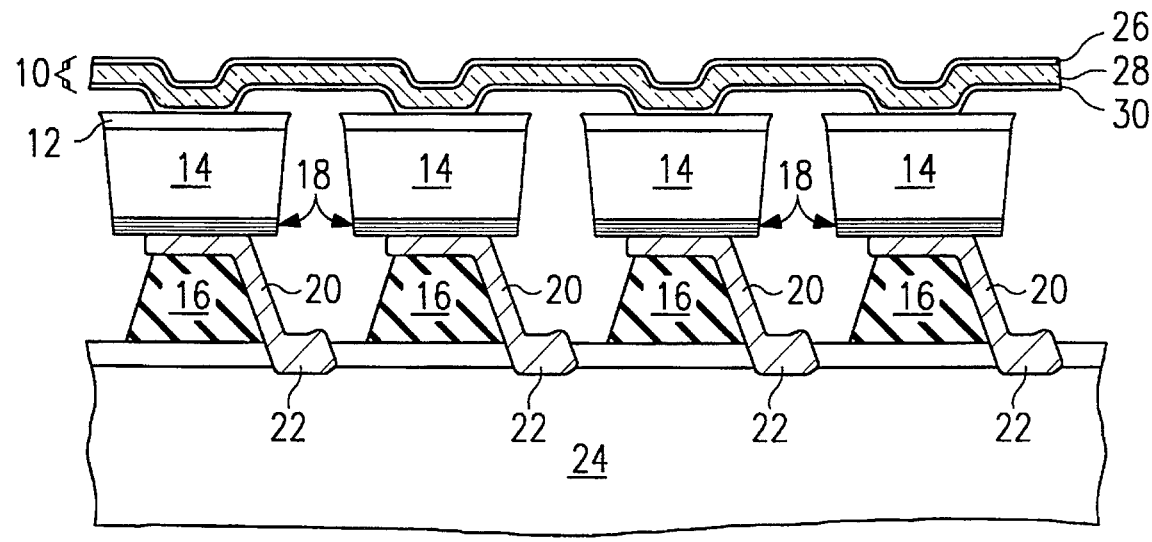
FIG. 1 is a sketch of the cross section of a low temperature IR sensing array attached to art underlying integrated circuit.
Figure 2:
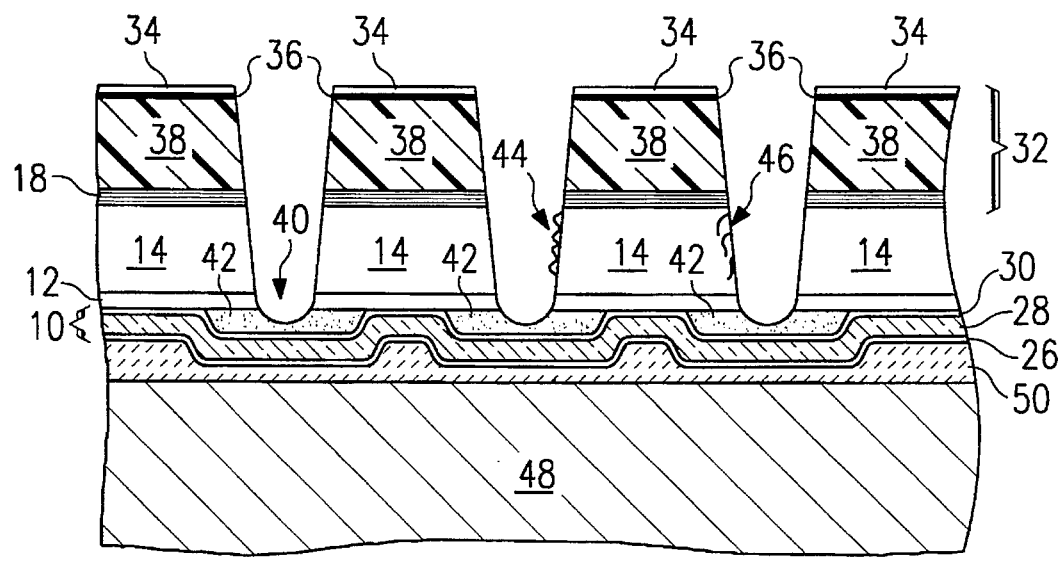
FIG. 2 shows the cross section of an inverted IR sensing array which has the BST dielectric thermally isolated by ion milling with concomitant surface damage in the trenches.

This invention will be described with the aid of FIGS. 1–2 and TABLEs 1–2. The figures have exaggerated thin film layer thicknesses and are not to actual or relative scale. Although a specific IR sensor design has been sketched in the figures, this invention is generic to all such arrays which achieve the thermal isolation of the pixels by ion milling. FIG. 1 shows a cross section of an IR sensing array system which consists of a sensing array and a signal processing IC 24. The impinging IR is absorbed by the optical coating 10 composed of layers 26, 28 and 30 as shown in TABLE 1. This coating is electrically and mechanically connected to metal 12 which forms the top electrode of the pixel capacitor and is electrically common to all other pixels. The thermally sensitive dielectric of the pixel capacitor is BST 14. The backside of the pixel capacitor is metal 18 which is electrically and thermally isolated from all other pixels.

As shown in FIG. 1, the BST dielectric 14 has been patterned to isolate it from its neighbor. FIG. 2 shows this isolation process in progress. In this case the isolation etching is performed from the backside by ion milling. With reference to FIG. 1, the IR array is inverted in FIG. 2 and mounted to a mechanical holder 48 by means of an adhesive 50 such as wax. A tri-level masking process 32 (photoresist, polyimides . . . ) is patterned initially by conventional photolithography and consists of layers 34, 36 and 38 as shown in TABLE 2. Ion milling is used to remove the BST in trenches 40 until it penetrates to the level of the organic layer 42. However, in the process of this ion milling there may result undesired depositions 44 of the ion milled products and electrical surface damage 46 on the pixel dielectric 14.

TABLE 1

| ID# | Description | Material (dim) | Alternates |
|---|---|---|---|
| 10 | Optical coating | 3 layered | ¼ IR wavelength |
| 12 | Conducting electrode | TiW | NiCr |
| 14 | Thermally sensitive substrate | Barium strontium titanate | |
| 16 | Isolation mesas | Polyimide | PMMA, photoresist |
| 18 | Backside electrical contact | Multiple alloys suitable for | 4-layer composite of 15–60 μm In |

TABLE 1-continued

| ID# | Description | Material (dim) | Alternates |
|---|---|---|---|
| | | IC bonding. | 0.5–1.5 μm Au |
| | | | 0.5–1.5 μm NiCr |
| | | | 0.2–1.0 μm TiW |
| 20 | Metal via connection | TiW | other electrically conductive materials with minimum thermal conductive characteristics |
| 22 | Via connection | | |
| 24 | Signal processing IC | Si or GaAs | |
| 26 | Transparent coat | NiCr 50A | 25–100A |
| 28 | ¼ wavelength separator coat | Parylene 1.4 μm | ¼ wavelength at desired IR |
| 30 | Electrical con-ducting coat | NiCr 1000A | 500–2000A |

Yet, the pixels 14 must be thermally isolated from adjacent pixel capacitors and free from electrical leakage. Therefore, both of these defects 44 and 46 must be removed to prevent faulty IR sensing arrays due to electrical leakage of the pixel capacitor charge.

TABLE 2

| ID# | Description | Material (dim) | Alternates |
|---|---|---|---|
| 32 | Etch mask for ion milling isolation trenches | Tri-level mask process | Photoresist 1–2 μm |
| 34 | | | TiW 500–1500A |
| 36 | | 1.5 μm | Photoresist 8–20 μm, other organics, as well as other multi-level masking processes |
| 38 | | | |
| 40 | Thermal isolation trench | | |
| 42 | Organic elevation level | PIRL 500–4000A | Photoresist, parylene or other organics |
| 44 | Undesired deposit | BST, metal, carbon, and/or organics | |
| 46 | BST surface damage | | |
| 48 | Mechanical holder | Glass | ceramic, silicon, or other similar materials |
| 50 | Adhesive | Wax | |

The removal of these defects 44 and 46 is achieved by means of a novel etch solution. The etch may be a wet acid, a dry etch, solvent etch or a ultra violet (UV) etch. The composition of this defect removing solution for a dry etch may include $CF_4$, $O_2$, $F_{12}$, H, or $SF_6$. The solvent etch may include IPA, Acetone, $MF_{312}$, or $H_{20}$. A wet etch may include: hydrofluoric acid, acetic, $HNO_3$, HBr, HI, $NH_4F$, $NH_4BR$, $NH_4$, $CaF_2$, KBr, NaI, hydrogen chloride, peroxide, phosphoric, perchloric acid, a solution of a chlorine salt and water which is then exposed to ultraviolet light or any similar chemical solution giving the correct reducing properties. The UV etch may include a chloride solution constituting of ten percent (10%) HCl plus water such that during irradiation, unmasked regions become substantially more reactive with the etchant than they are absent exposure to the UV radiation. The mask and ion milling may be applied from either the front side or the back side of the infrared detector.

While this invention has been described with reference to illustrative embodiments, this description is not intended to be construed in a limiting sense. A specific device drawing was used for example only and any of the ion milled variants of this sensor previously disclosed in the referenced and co-pending patent applications are equally covered. Some embodiments use electrode layer 12 and some do not. Some have the thermal isolation ion mill etch performed both from the front and back of the pixel dielectric substrate. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of etching of pyroelectric devices post ion milling, said method comprising:
   a. forming a mask for thermal isolation trenches on a substrate;
   b. ion milling thermal isolation trenches in said substrate; and
   c. etching undesired defects caused by said ion milling from said trenches.

2. The method of claim 1, wherein said etching includes applying a hydrofluoric acid to said trenches.

3. The method of claim 1, wherein said etching includes applying a perchloric acid to said trenches.

4. The method of claim 1, wherein said etching includes applying a hydrochloric acid to said trenches.

5. The method of claim 1, wherein said etching includes applying a solution of a chlorine salt and water which is then exposed to ultraviolet light.

6. The method of claim 1, wherein said etching includes dry etching said trenches.

7. The method of claim 1, wherein said etching includes applying a solvent etch.

8. The method of claim 1, wherein said method further includes:
   a. forming a common electrode over said substrate first;
   b. forming an optical coating over said common electrode;
   c. forming said mask on a backside of said substrate, all before said ion milling.

9. The method of claim 8, wherein said method further includes forming a contact metal on said backside of said substrate before said forming said mask.

10. The method of claim 1, wherein said mask is formed on a front side of said substrate.

11. A method of etching of pyroelectric devices post ion milling, said method comprising:
   a. forming a common electrode over said substrate;
   b. forming an elevation layer over portions of said common electrode;
   c. forming an optical coating over said elevation layer and said common electrode;
   d. forming a mask for thermal isolation trenches on a backside of said substrate;
   e. ion milling thermal isolation trenches in said substrate; and
   f. etching undesired defects caused by said ion milling from said trenches.

12. The method of claim 11, wherein said method further includes forming a contact metal on said backside of said substrate before said forming said mask.

13. The method of claim 11, wherein said etching includes applying a hydrofluoric acid to said trenches.

14. The method of claim 11, wherein said etching includes applying a hydrochloric acid to said trenches.

15. The method of claim 11, wherein said etching includes applying a perchloric acid to said trenches.

16. The method of claim 11, wherein said etching includes applying a solution of a chlorine salt and water which is then exposed to ultraviolet light.

17. The method of claim 11, wherein said etching includes dry etching said trenches.

18. The method of claim 11, wherein said etching includes applying a solvent etch.

19. A method of etching of pyroelectric devices post ion milling, said method comprising:
   a. forming a mask for thermal isolation trenches in a substrate;
   b. ion milling said thermal isolation trenches in said substrate;
   c. etching undesired defects caused by said ion milling from said trenches;
   d. depositing a trench filler in said thermal isolation trenches;
   e. depositing a common electrode layer over said thermal isolation trenches;
   f. depositing an optical coating above said common electrode layer;
   g. etching a backside of said substrate to expose said trench filler;
   h. depositing a contact metal on said backside of said substrate; and
   i. etching said contact metal and said trench filler to form pixel mesas of said contact metal and said substrate.

20. The method of claim 19, wherein said etching includes applying a hydrofluoric acid.

21. The method of claim 19, wherein said etching includes applying a hydrochloric acid.

22. The method of claim 19, wherein said etching includes applying a perchloric acid.

23. The method of claim 19, wherein said etching includes applying a solution of a chlorine salt and water which is then exposed to ultraviolet light.

* * * * *